(12) United States Patent
Jang et al.

(10) Patent No.: US 6,562,668 B2
(45) Date of Patent: May 13, 2003

(54) METHOD OF FABRICATING THIN FILM TRANSISTOR USING BUFFER LAYER AND THE THIN FILM TRANSISTOR

(76) Inventors: Jin Jang, 102-1103, Hyundae Apt. 53, Jamwon-dong, Seocho-ku, Seoul (KR); In Keun Woo, Kyung Hee University 1 Hoegi-dong, Seoul (KR); Sang Wook Lee, Kyung Hee University 1 Hoegi-dong, Seoul (KR)

(*) Notice: Subject to any disclaimer, the term of this patent is extended or adjusted under 35 U.S.C. 154(b) by 0 days.

(21) Appl. No.: 09/927,362

(22) Filed: Aug. 13, 2001

(65) Prior Publication Data

US 2002/0025614 A1 Feb. 28, 2002

(30) Foreign Application Priority Data

Aug. 12, 2000 (KR) .................................. 2000-0046737
Aug. 19, 2000 (KR) .................................. 2000-0048048
Jan. 9, 2001 (KR) .................................. 2001-0000907

(51) Int. Cl.[7] .............................................. H01L 21/00
(52) U.S. Cl. ...................... 438/158; 438/151; 438/152; 438/153; 438/154; 438/155; 438/166
(58) Field of Search ................................. 438/151, 166

(56) References Cited

U.S. PATENT DOCUMENTS 6,160,270 A * 12/2000 Holmberg et al.

OTHER PUBLICATIONS

Sang Wook Lee et al.; "Hydrogenated Amorphous Silicon Thin–Film Transistor Using APC Alloy for Both Gate and Data Bus Lines; " Dept. of Physics and TFT–LCD Nat'l Lab.; Kyung Hee University, Dongdaemoon–ku, Seoul 130–701, Korea.

S.W. Lee et al.; "Hyddrogenated Amorphous Silicon Thin–Film Transistor Using a Cu Gate with $Al_xO_c$/AlN Buffer;" Dept. of Physics and TFT–LCD Nat'l Lab.; Kyung Hee University, Dongdaemoon–ku, Seoul 130–701, Korea.

I.K. Woo et al.; "High Performance a–Si:H TFT using Cu Gate;" Dept. of Physics, Kyung Hee University, Dongdaemoon–ku, Seoul, Korea; KLCC 2000, vol. 3, pp 95–98.

* cited by examiner

Primary Examiner—John F. Niebling
Assistant Examiner—Stanetta Isaac
(74) Attorney, Agent, or Firm—Birch, Stewart, Kolasch & Birch, LLP (57) ABSTRACT

In the method of fabricating a thin film transistor, a first aluminum layer, which is later oxidized, or aluminum nitride layer is formed on a glass substrate. A metal gate is formed on the aluminum layer or the aluminum nitride layer. Oxidation of the aluminum layer is carried either prior to or after forming the gate. A thin film transistor structure that includes the metal gate is then formed over the substrate.

28 Claims, 12 Drawing Sheets

METHOD OF FABRICATING THIN FILM TRANSISTOR USING BUFFER LAYER AND THE THIN FILM TRANSISTOR

BACKGROUND OF THE INVENTION

1. Field of the Invention

The present invention relates to a method of fabricating a thin film transistor and the thin film transistor.

2. Background of the Related Art

An inverse staggered type thin film transistor (hereinafter abbreviated TFT) is widely used for a thin film transistor—liquid crystal display (hereinafter abbreviated TFT-LCD) panel. A metal is deposited on a glass substrate for the inverse staggered type TFT. However, reliance of the device is reduced due to a difference between the thermal expansion coefficients of metal and glass as well as stress, which results in metal peeling. In most cases, a gate metal is deposited on a buffer layer, which has been formed on the glass substrate. Silicon nitride and silicon oxide are widely used as the buffer layers. Yet, such a buffer layer can only be used when the adhesion of the metal is excellent. Thus, some metals fail to overcome the above defects. Stacked-metal structures have been proposed to overcome such defects and contribute greatly to metal diffusion and adhesion improvement. However, these proposed structures fail to avoid reductions in productivity. Another metal mixing method fails to reduce resistance due to the metal mixtures.

As the size of a TFT-LCD panel increases, metals having low resistance are required. Cu($1.67\,\mu\Omega.cm$) and Ag—Pd—Cu alloy (hereinafter abbreviated APC) (under $2.2\,\mu\Omega.cm$) have low resistance, but they have unstable properties such as poor adhesion with the glass substrate. Namely, adhesion of Cu is poor. Cu also has a tendency to diffuse into a silicon film and has to be mixed with other metals such as Cr, Mg or/and the like, thereby increasing the resistance thereof. Compared to Cu, APC has no tendency to diffuse into a silicon film, but has poor adhesion, thereby failing to avoid the film peeling problem.

Moreover, metals having low resistance such as Cu, APC and the like are vulnerable to deformation due to their weakness. Specifically, in a plasma process for depositing a film, characteristic degradation such as roughness and resistance of such metals and the like are increased due to a reaction between the metals and the gas. And, metal diffusion occurs in the plasma process due to the process temperature. To overcome these problems, a buffer layer is formed on the metal. This process is divided into three methods, one using stable metals such as Mo, Cr, W, and Ti, one using an oxide layer such as $Cr_2O_3$ and $Al_2O_3$ by thermally treating the metals, and one using a nitride layer such as AlN and TiN by carrying out thermal treatment in a nitrogen ambient atmosphere. Also these methods of using a metal film need to carry out photolithography twice to pattern the metal for securing a stable buffer state, thereby complicating the formation process.

SUMMARY OF THE INVENTION

Accordingly, the present invention is directed to a method of fabricating a thin film transistor using a buffer layer that substantially obviates one or more problems due to limitations and disadvantages of the related art.

An object of the present invention is to provide a method of fabricating a thin film transistor and a thin film transistor using a buffer layer so as to reduce the deformation of a metal having weak resistivity when depositing a film.

Another object of the present invention is to provide a method of fabricating a thin film transistor and the thin film transistor using a buffer layer, thereby improving adhesion of low resistance metals used for TFT gate metals.

In the present invention an aluminum oxide or nitride layer is deposited to use as a buffer layer. The aluminum oxide layer is formed by oxygen plasma treatment using PECVD (Plasma Enhanced Chemical Vapor Deposition) so as to form an alumina layer having no impurity instantly. And, the aluminum nitride layer is formed using RF magnetron sputtering. A metal gate is then patterned on the buffer layer. The buffer layer improves the adhesion between the glass substrate and the gate metal. In further preferred embodiments, a second aluminum oxide layer or aluminum nitride layer, as a second buffer layer, is formed over the metal gate and the first buffer layer. The second buffer layer helps prevent the deformation of the metal gate during the subsequent processing step to form the TFT that includes the metal gate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
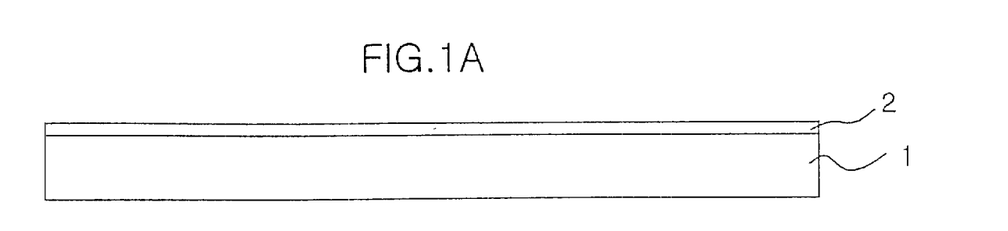
FIG. 1A to FIG. 1C illustrate cross-sectional views of patterning a gate metal of a TFT using a first alumina layer on a glass substrate according to an embodiment of the present invention.
Figure 1B:
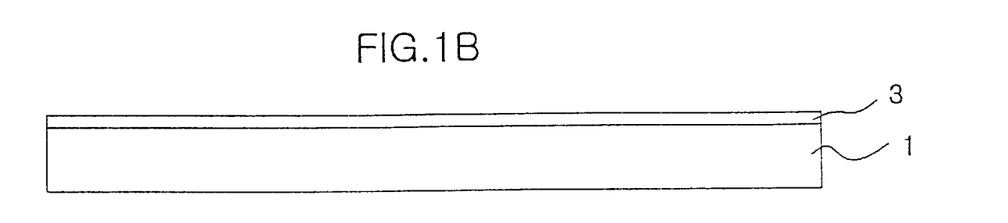
Figure 1C:
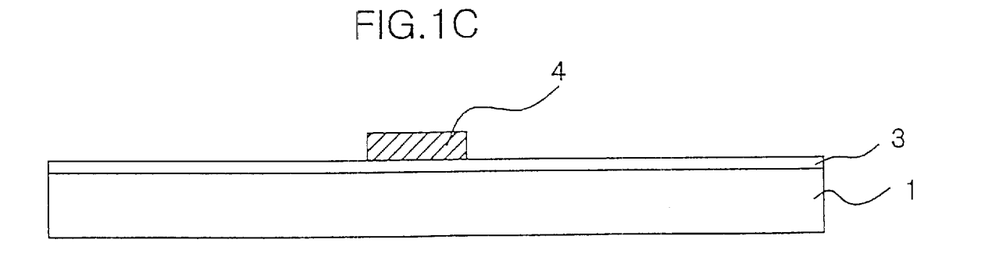

FIG. 1A to FIG. 1C illustrate cross-sectional views of patterning a gate metal of a TFT using a first alumina layer on a glass substrate according to an embodiment of the present invention.

As shown in FIG. 1A, an aluminum layer 2 is deposited 3 to 10 nm thick on a glass substrate 1. The aluminum layer 2 is oxidized by wet or dry oxidation to form an alumina (i.e., aluminum oxide) layer 3 in FIG. 1B in the same manner as described in detail below with respect to FIG. 2B. A Cu or APC layer is deposited thereon, and then patterned to form a gate 4 using a mask.

FIG. 2A to FIG. 2E illustrate cross-sectional views of patterning a gate metal of a TFT using first and second alumina layers on a glass substrate according to another embodiment of the present invention.

Figure 2A:
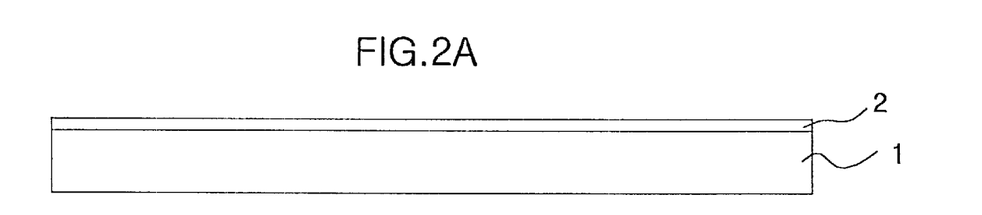
FIG. 2A to FIG. 2E illustrate cross-sectional views of patterning a gate metal of a TFT using first and second alumina layers on a glass substrate according to another embodiment of the present invention.

After cleaning glass to use as a substrate, aluminum is deposited by RF magnetron sputtering (herein after abbreviated "sputter") as shown in FIG. 2A on a glass substrate 1. Aluminum (3–5 nm) is deposited at room temperature with an RF power of 100 W at a gas pressure of 20 mTorr.

Figure 2B:
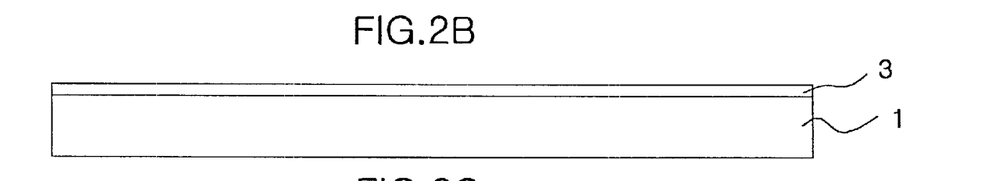

The aluminum layer 2 is oxidized by wet or dry oxidation a shown in FIG. 2B to form an alumina layer 3. In wet oxidation, the substrate 1 on which aluminum is deposited is dipped in an $H_2O$—$NH_4OH$—$H_2O_2$ solution while the temperature is increased up to 80° C., whereby an alumina layer 3 is formed. In dry oxidation using oxygen plasma, the alumina layer 3 is formed by supplying oxygen at a flow of 20 to 30 sccm and applying RF plasma of 300W for 10 to 15 minutes.

Figure 2C:
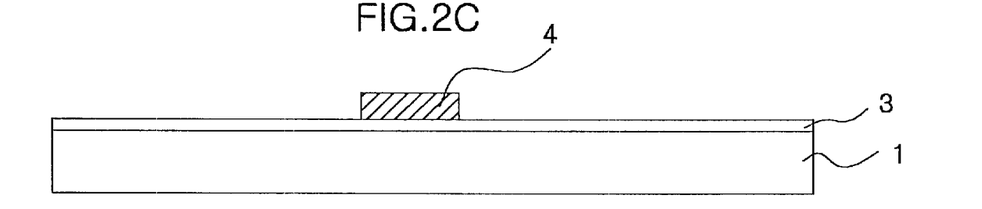
Figure 2D:
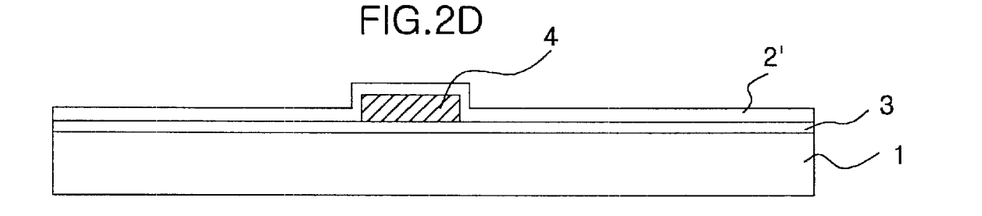

Gate metal such as Cu, APC or the like is formed on the alumina layer 3 under the same condition as the aluminum sputtering. A gate 4 is then formed using photolithography.

Figure 2E:
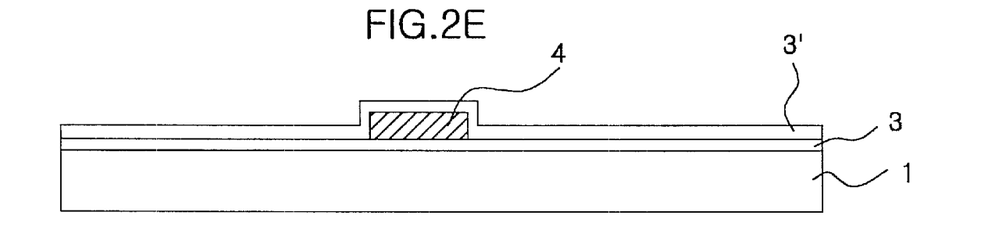

A second alumina layer 3' is formed over the substrate 1 by the above same method.

FIG. 3A to FIG. 3D illustrate cross-sectional views of patterning a gate metal of a TFT on a glass substrate using first and second alumina layers oxidized simultaneously according to a further embodiment of the present invention.

As first and second alumina layers 3 and 3' are formed simultaneously, the process is simplified compared to the process in FIG. 2A to FIG. 2E, and adhesion at a bottom of a gate metal 4 is conserved by aluminum.

Figure 3A:
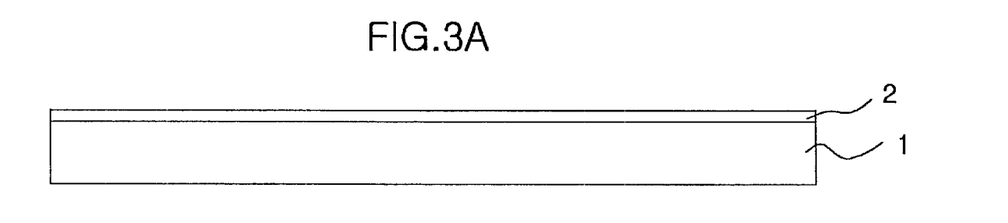
FIG. 3A to FIG. 3D illustrate cross-sectional views of patterning a gate metal of a TFT on a glass substrate using first and second alumina layers oxidized simultaneously according to a further embodiment of the present invention.
Figure 3B:
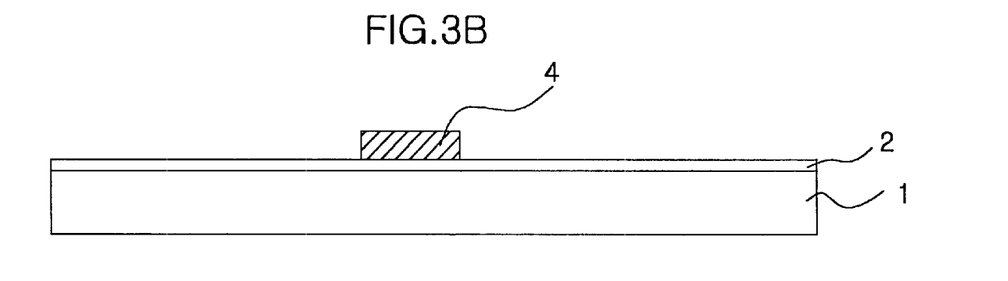
Figure 3C:
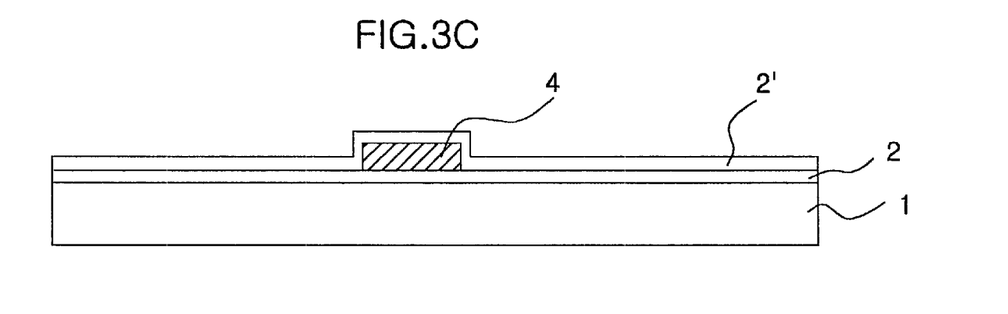
Figure 3D:
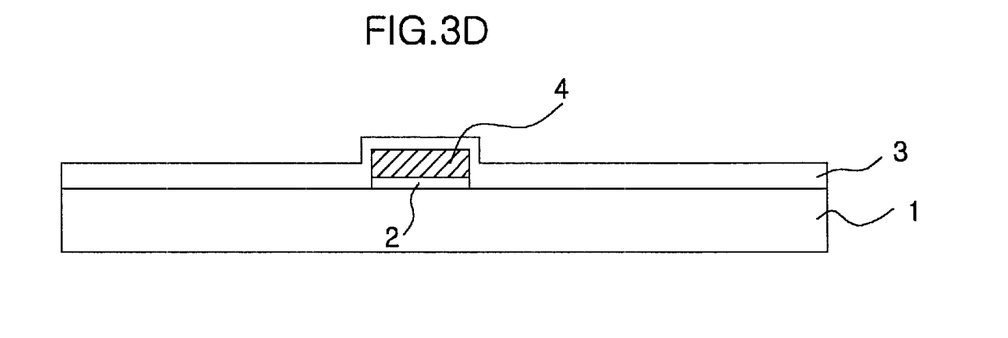

As shown in FIG. 3A, a first aluminum layer 2 is deposited on a glass substrate 1. Then a CU or APC layer is deposited thereon and patterned to form a gate 4 as shown in FIG. 3B. A second aluminum layer 2' is deposited over the substrate 1 in FIG. 3C. Next, as shown in FIG. 3D, the first and second aluminum layers 2 and 2' are oxidized simultaneously to form alumina layer 3. During the oxidation process, the gate 4 acts as a mask such that a portion of the first aluminum layer 2 remains under the gate 4. This portion of aluminum promotes adhesion between the gate 4 and the substrate 1.

Next, continued processing of the TFT gate metal structure formed by FIGS. 1A–1C, 2A–2E, or 3A–3D to form a TFT will be described with reference to FIGS. 4, 5A and 5B. For the purposes of explanation only, FIGS. 4, 5A and 5B illustrate these further processing steps performed on the resulting gate metal structure of FIG. 3D, but it will be understood that the further processing steps are equally applicable to the gate metal structures of FIGS. 1C and 2E.

Figure 4:
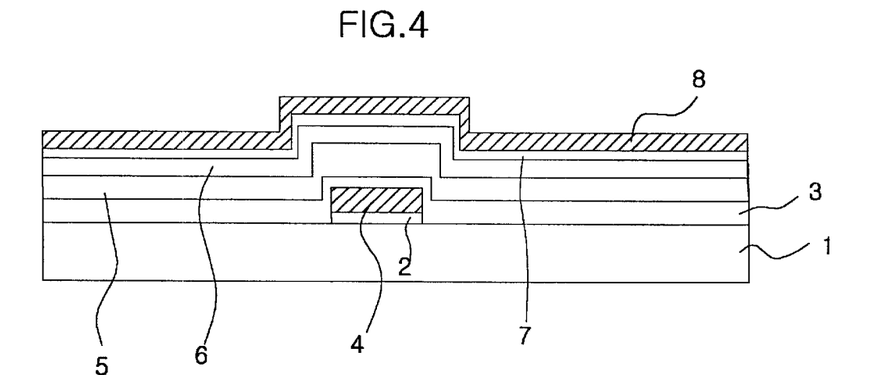
FIG. 4 illustrates a cross-sectional view of a TFT having an impurity-doped silicon layer, a nitride layer, an active layer, and a metal as a source and a drain according to the present invention.

A gate insulating layer 5, an active layer 6, an impurity-added silicon layer 7, and a source/drain metal 8 are deposited in order as shown in FIG. 4. These successive depositions are carried out using PECVD without air-contact between the films.

Specifically, a nitride layer 200 to 300 nm thick is deposited at a substrate temperature of 240 to 270° C. with an RF power of 30 W at a gas pressure of 400 mTorr to form the gate insulating layer 5. Then, an amorphous silicon layer 120 to 150 nm thick as the active layer 6 is deposited at a substrate temperature of 240 to 270° C. with a $SiH_4$ gas flow of 1.0 sccm and an RF power of 10W at a gas pressure of 400 mTorr. The impurity-added silicon layer 7 is deposited successively without turning off the plasma. In this case, 2 sccm of $PH_3$ is added to the gas flow that was used in depositing the amorphous silicon layer (this forms an N-type layer 7). As the deposition is carried out successively, the contact resistance is reduced. After the deposition of the impurity-added silicon layer 7, the source/drain metal 8 is deposited in the sputter. The source/drain metal 8 is any metal such as nickel (Ni) that has a low resistance; particularly, when converted to a silicide.

Figure 5A:
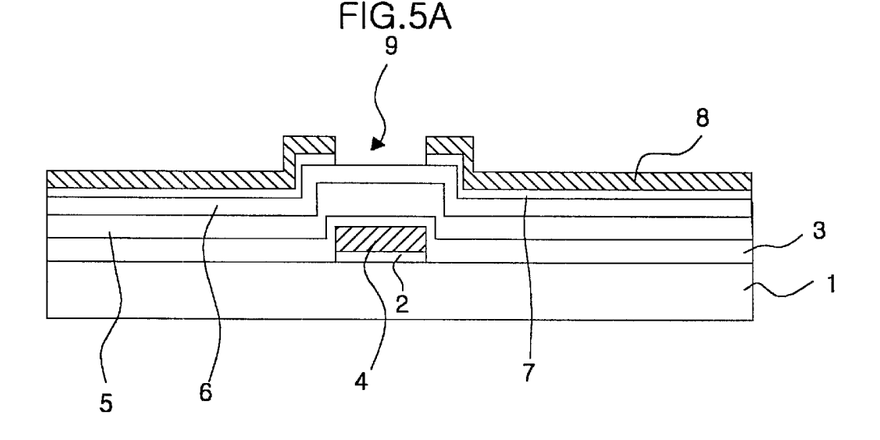
FIG. 5A and FIG. 5B illustrate cross-sectional views of etching layers for fabricating a TFT according to the present invention.
Figure 5B:
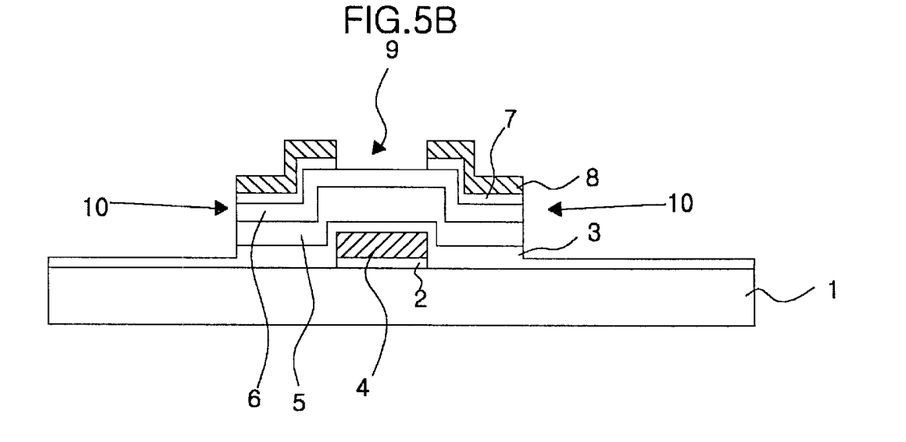

Next, as shown in FIG. 5A, the deposited sample undergoes photolithography so as to pattern the source/drain metal 8. Specifically, a portion of a positive photoresist (hereinafter abbreviated PR) irradiated with UV (ultraviolet) rays is etched when developing is carried out. Then, etching of an exposed portion of the source/drain metal 8 and the impurity-added silicon layer 7 forms a channel 9 as shown in FIG. 5A.

Thereafter, PR is spin-coated at 3000 to 4500 rpm (round per minute), and soft-baked at 90° C. for 20 to 30 minutes before UV-ray irradiation. Soft-baking evaporates volatile components in PR to be solidified. After soft-baking, an index of the sample is adjusted properly in an aligner (UV range: 300 to 500 nm). Then, UV is irradiated on the sample. The irradiated portion is etched in a developer. And, hard-baking is carried out to harden PR at a temperature of 110° C. for 20 minutes. The prepared sample is then etched as shown by 10 in FIG. 5B.

The etch 10 has two objectives: (1) of isolating the active layer of the sample like an island and (2) enabling measurement by opening the gate 4. Thus, the etching is carried out on the active layer 6 and the silicon nitride layer 5 until the gate is completely opened. Successively, the alumina layer 3 is partially etched. FIG. 5B shows the cross-section after the etching. Measuring can be performed by removing the remaining PR.

Formation of Ni-silicide reduces the contact resistance between the metal 8 and the impurity-added silicon layer 7 so as to improve the current flow. Thermal treatment is carried out at a temperature of 240 to 270° C. for 100 minutes. At this temperature, Ni and Si form NiSi at a boundary of Si so as to reduce the contact resistance. Thermal treatment is carried out at an ambience of He, $H_2$ or $N_2$ since a back face of the channel is exposed. Output and transition characteristics of TFT are measured using any well-known measurement device such as Hewlett Packard's model HP-4156B.

Figure 6:
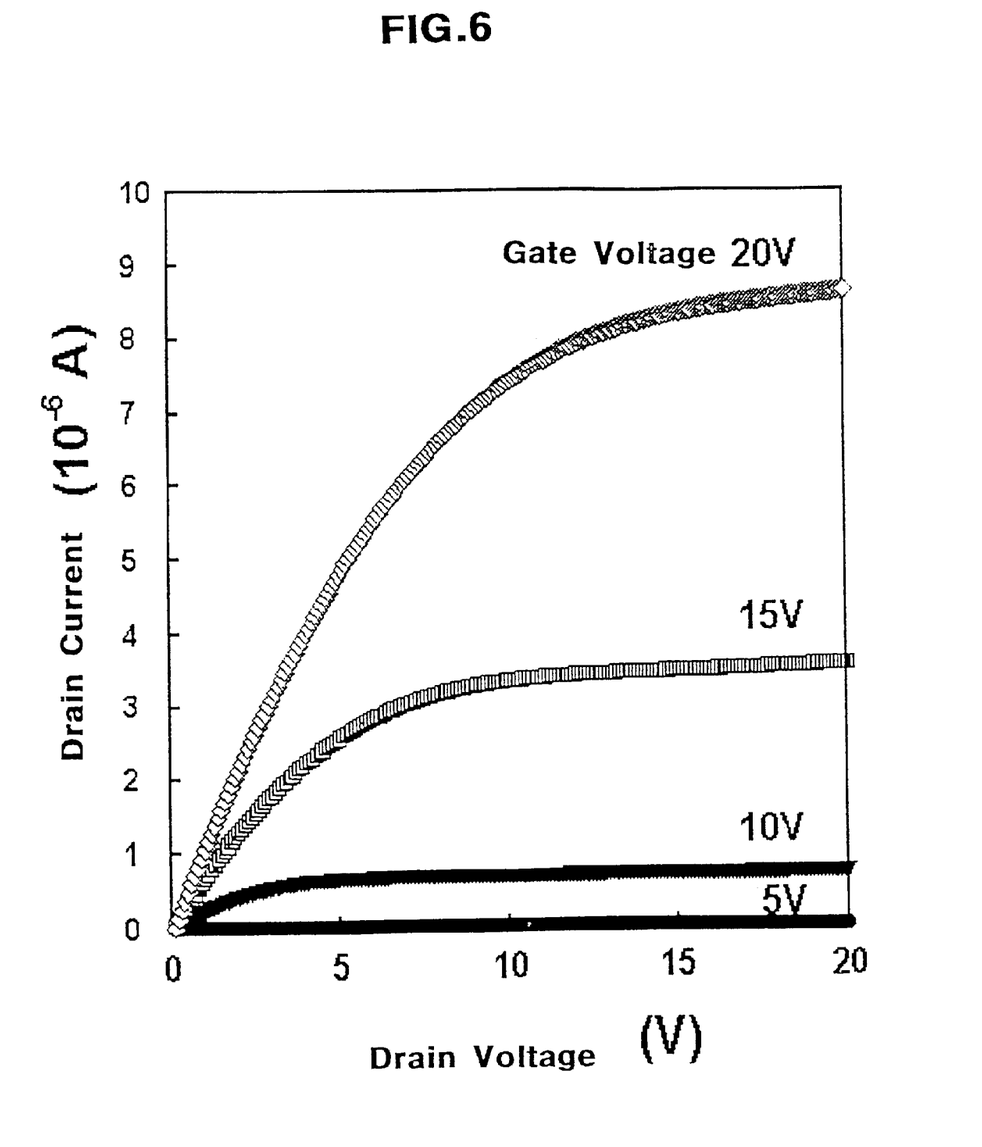
FIG. 6 illustrates a graph of an output characteristic of a TFT fabricated by the present invention.
Figure 7:
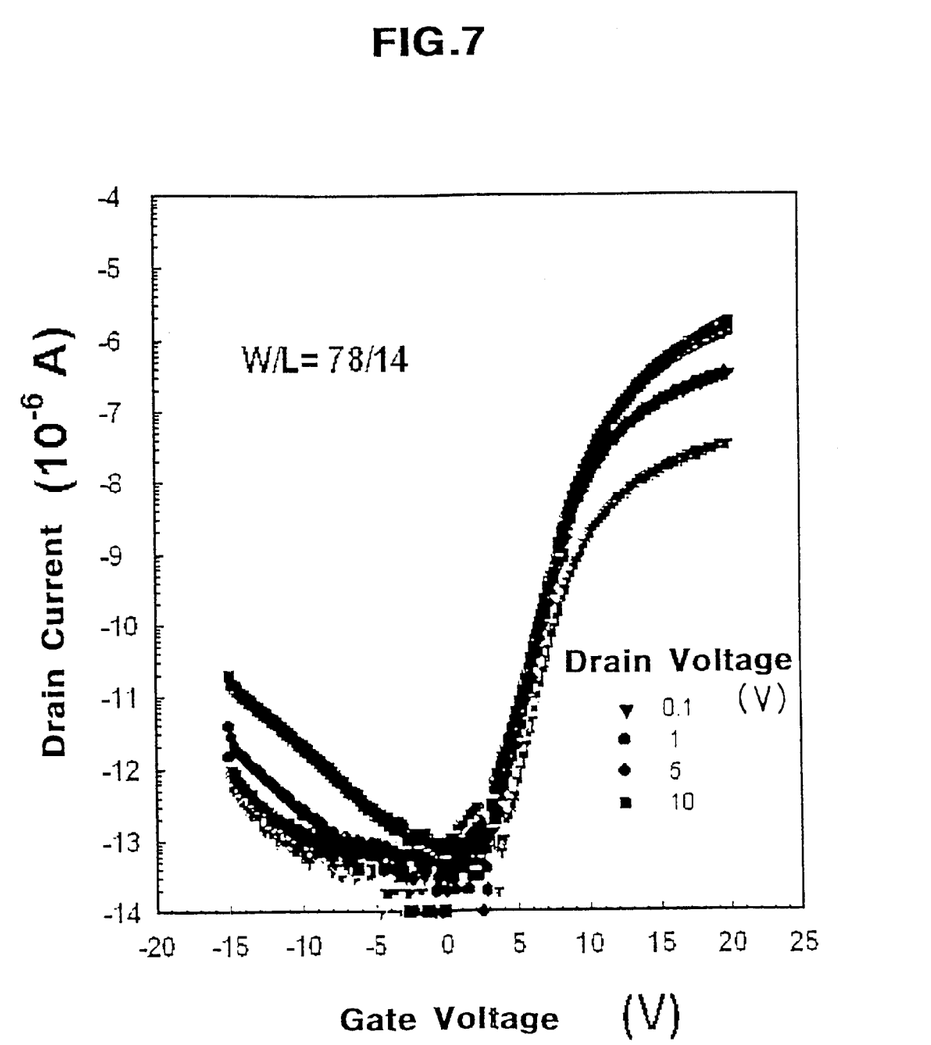
FIG. 7 illustrates a graph of a transfer characteristic of a TFT fabricated by the present invention.

FIG. 6 illustrates a graph of an output characteristic of a TFT fabricated by the present invention and FIG. 7 illustrates a graph of a transfer characteristic of a TFT fabricated by the present invention, wherein Cu and Ni are used as gate and source/drain metals, respectively.

FIG. 6 illustrates a graph of an output characteristic of a TFT fabricated by the present invention using an Al oxide layer as a buffer layer. As shown in the drawing, a W/L ratio, where W and L are width and length of a channel of TFT respectively, is 78 $\mu$m/14 $\mu$m. Drain current according to the drain voltage is measured by applying 5V, 10V, 15V, and 20V to the gate. In a low drain voltage area, a linear characteristic free from current crowding is shown. Current saturation is shown at a high drain voltage, and drain current increases greatly according to the gate voltage increasing.

FIG. 7 illustrates a graph of a transfer characteristic of a TFT fabricated by the present invention using an Al oxide layer as a buffer layer, in which a transfer characteristic of Log [drain current vs. gate voltage] is shown. When the drain voltage is 5V and 10V, the off-current at a gate voltage of −5V is $1\times10^{-13}$ A and $2.3\times10^{-13}$ A respectively.

Figure 8A:
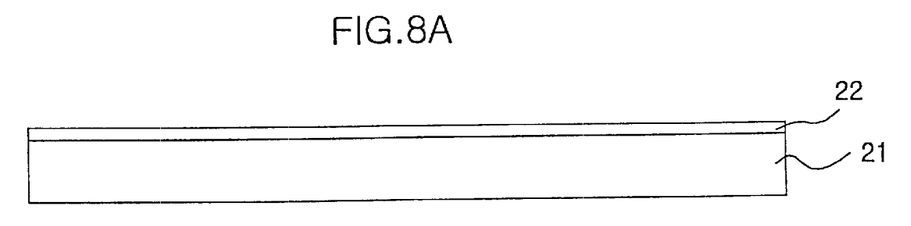
FIG. 8A and FIG. 8B illustrate cross-sectional views of patterning a gate metal of a TFT using a first aluminum nitride layer on a glass substrate according to the present invention.
Figure 8B:
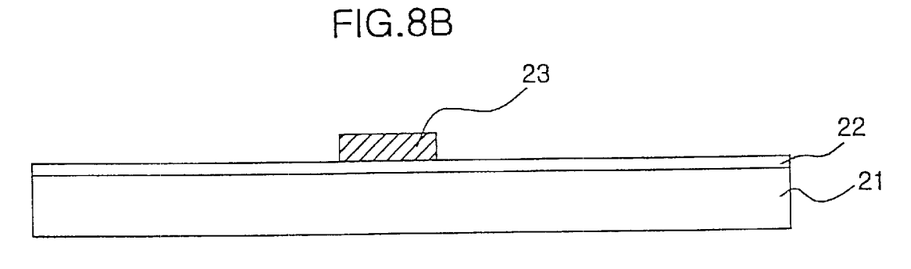

Next further embodiments of the present invention will be described. FIG. 8A and FIG. 8B illustrate cross-sectional views of patterning a gate metal of a TFT using a first aluminum nitride layer on a glass substrate according to the present invention, in which a first aluminum layer is used for improving an adhesiveness between a film and a glass substrate.

As shown in FIG. 8A, an aluminum nitride layer 22 is deposited to 10 nm thick on a glass substrate 1, but preferably to 3–5 nm thick in the same manner as described in detail below with respect to FIG. 9A. Then, a Cu or APC metal is deposited and patterned to form a metal gate 23 as shown in FIG. 8B.

Figure 9A:
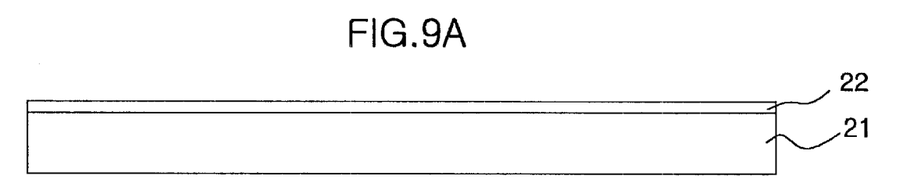
FIG. 9A to FIG. 9C illustrate cross-sectional views of patterning a gate metal of a TFT using first and second aluminum nitride layers on a glass substrate according to the present invention.
Figure 9B:
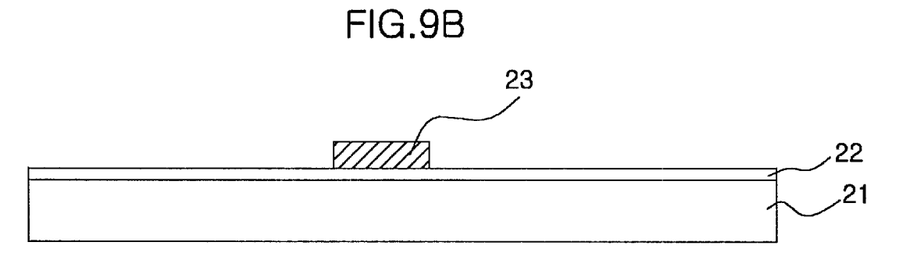
Figure 9C:
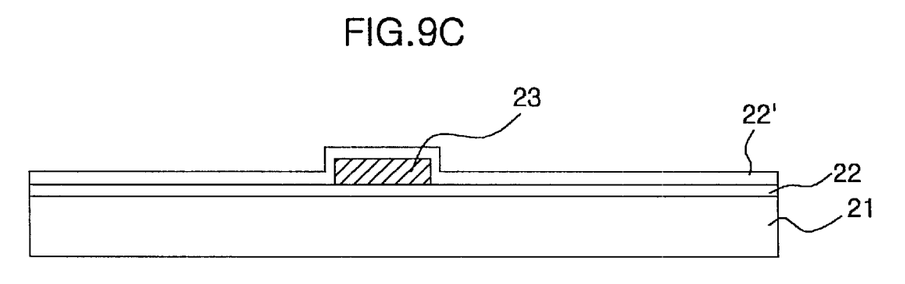

FIG. 9A to FIG. 9C illustrate cross-sectional views of patterning a gate metal of a TFT using first and second aluminum nitride layers on a glass substrate according to the present invention. An aluminum nitride layer is formed on a gate metal pattern so as to prevent metal from diffusing into an upper film or metal from being deformed due to plasma.

After cleaning glass to use as a substrate, aluminum is deposited in a radio frequency magnetron sputter. Aluminum nitride 22 is deposited 3 to 5 nm at room temperature with an RF power of 100W at a gas pressure of 20 mTorr as shown in FIG. 9A. In this case, the sputter target is pure aluminum and nitrogen gas instead of using argon (Ar). Aluminum is deposited on the sample by being nitrogenized by nitrogen (reactive sputtering). A gate metal such as Cu, APC or the like is formed on the aluminum nitride layer 22 under the same condition as the aluminum nitride sputtering. A gate 23 is then formed from the gate metal using photolithography as shown in FIG. 9B. A second aluminum nitride layer 22' is formed over the substrate 1 by the above same method used to form the first aluminum nitride layer 22. The second aluminum nitride layer is formed to a thickness of 20 nm or less, but preferably 5 to 10 nm.

Figure 10:
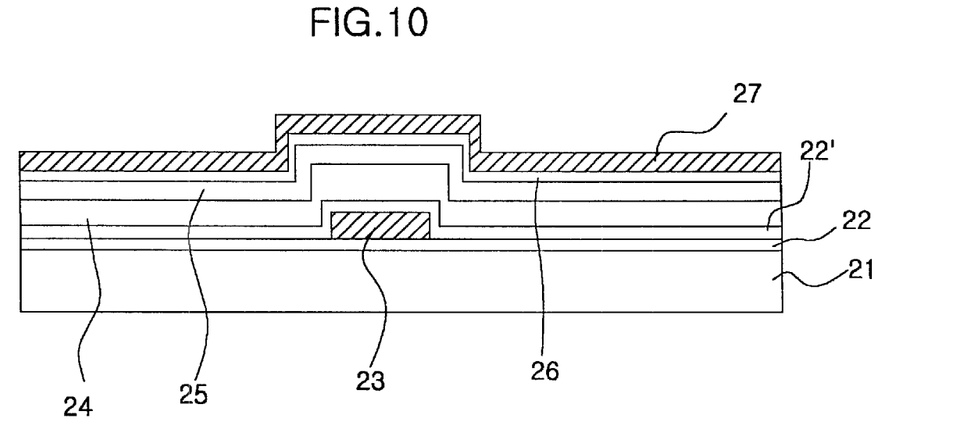
FIG. 10 illustrates a cross-sectional view of a TFT having a silicon nitride layer, an active layer, an impurity-doped silicon layer, and a metal as a source and a drain according to the present invention.
Figure 11A:
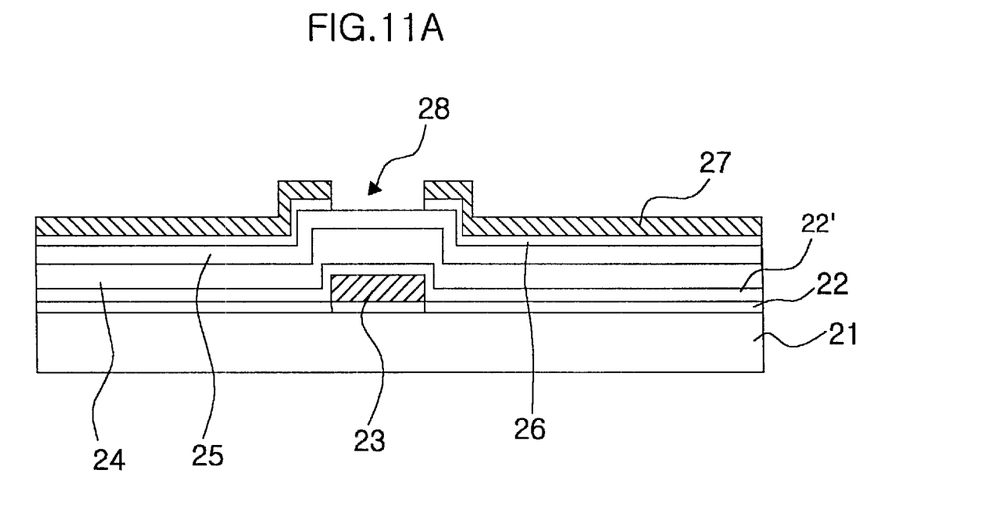
FIG. 11A and FIG. 11B illustrate cross-sectional views of etching layers for fabricating a TFT according to the present invention.
Figure 11B:
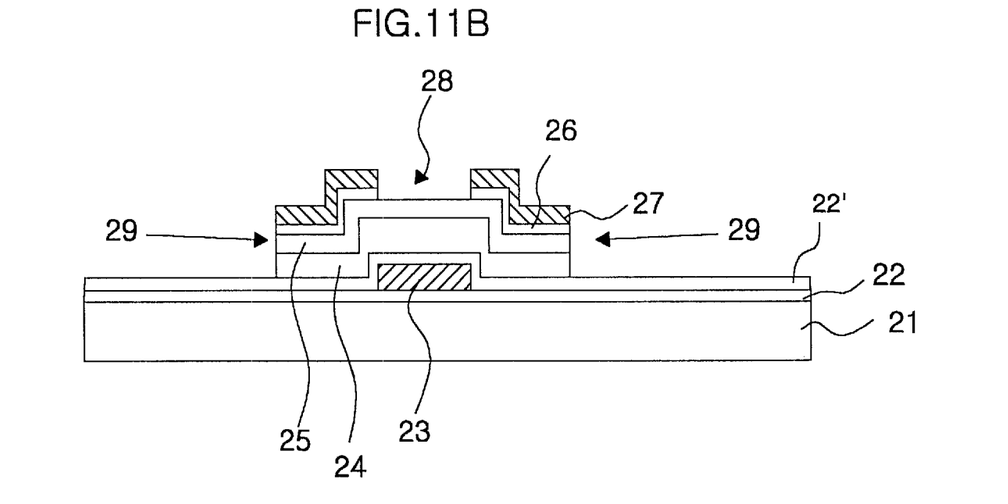

Next, continued processing of the TFT gate metal structure formed by FIGS. 8A–8B or 9A–9C to form a TFT will be described with reference to FIGS. 10, 11A and 11B. For the purposes of explanation only, FIGS. 10, 11A and 11B illustrate these further processing steps performed on the resulting gate metal structure of FIG. 9C, but it will be understood that the further processing steps are equally applicable to the gate metal structure of FIG. 8B. A gate insulating layer 24, an active layer 25, an impurity-added silicon layer 26, and a source/drain metal 27 are deposited in order as shown in FIG. 10. These successive depositions are carried out using PECVD without air-contact between the respective films and the air.

Specifically, a silicon nitride layer 24 is deposited 200 to 300 nm thick at a substrate temperature of 240 to 270° C. with an RF power of 30W at a gas pressure of 400 mTorr. Then, an amorphous silicon layer 25, as the active layer 25, is deposited 120 to 150 nm thick at a substrate temperature of 240 to 270° C. with a silane ($SiH_4$) gas flow of 1.0 sccm and an RF power of 10W at a gas pressure of 400 mTorr. The impurity-added silicon layer 26 is deposited successively without turning off the plasma. In this case, 2 sccm of $PH_3$ is added to the gas flow for depositing the amorphous silicon layer 25. As the deposition is carried out successively, the contact resistance is reduced. After the deposition of the impurity-added silicon layer 26, the source/drain metal 27 is deposited in the sputter. The source/drain metal 27 is any metal such as nickel (Ni) that has a low resistance; particularly, when converted to a silicide.

Next, as shown in FIG. 11A, the deposited sample undergoes photolithography so as to pattern the source/drain metal 27. A portion of PR irradiated with UV (ultraviolet) rays is removed when developing is carried out. Then, an etching of an exposed portion of the source/drain metal 27 and the impurity-added silicon layer 26 forms a channel 28 as shown in FIG. 11A. The PR remaining is removed after completion of the etching by dipping the sample in a remover (developer), the temperature of which is maintained at about 80° C.

Thereafter, PR is spin-coated at 3000 to 4500 rpm, and soft-baked at 90° for 20 to 30 minutes before UV-ray irradiation. Soft-baking evaporates volatile components in PR to be solidified. After soft-baking, an index of the sample is adjusted properly in an aligner (UV range: 300 to 500 nm). Then, UV is irradiated on the sample. The irradiated portion is removed in a developer. Hard-baking is carried out to harden PR at a temperature of 110° C. for 20 minutes. The prepared sample is then etched as shown by 29 in FIG. 11B.

Therefore, if a succeeding process is carried out by leaving the aluminum nitride layer on a surface of the glass, it is able to avoid the deformation of the gate metal. Besides, the aluminum nitride is removed with ease if not necessary any more. The aluminum nitride layer is easily removed by an NaOH solution. NaOH solution enables removal without causing damage or deformation on other films.

The PR is removed completely by dipping the sample in the remover, the temperature of which is maintained about 80° C. The etching 29 has two objectives: (1) isolating the active layer of the sample like an island and (2) enabling measurement by opening the gate 23. Thus, the etching is carried out successively on the active layer 25 and the silicon nitride layer 24 until the gate 23 is completely opened. Successively, the second aluminum nitride layer 22' is etched. FIG. 11B shows the cross-section after the etching. Measuring can be performed by removing the remaining PR.

Formation of Ni-silicide reduces the contact resistance between the metal and the impurity-added silicon layer so as to improve the current flow. Thermal treatment is carried out at a temperature of 240 to 270° C. for 100 minutes. At this temperature, Ni and Si form NiSi at a boundary of Si so as to reduce the contact resistance. Thermal treatment is carried out at an ambience of He, $H_2$ or $N_2$ since a back face of the channel is exposed. Output and transfer characteristics of TFT are measured using the HP-4156B (product of Hewlett Packard).

Figure 12:
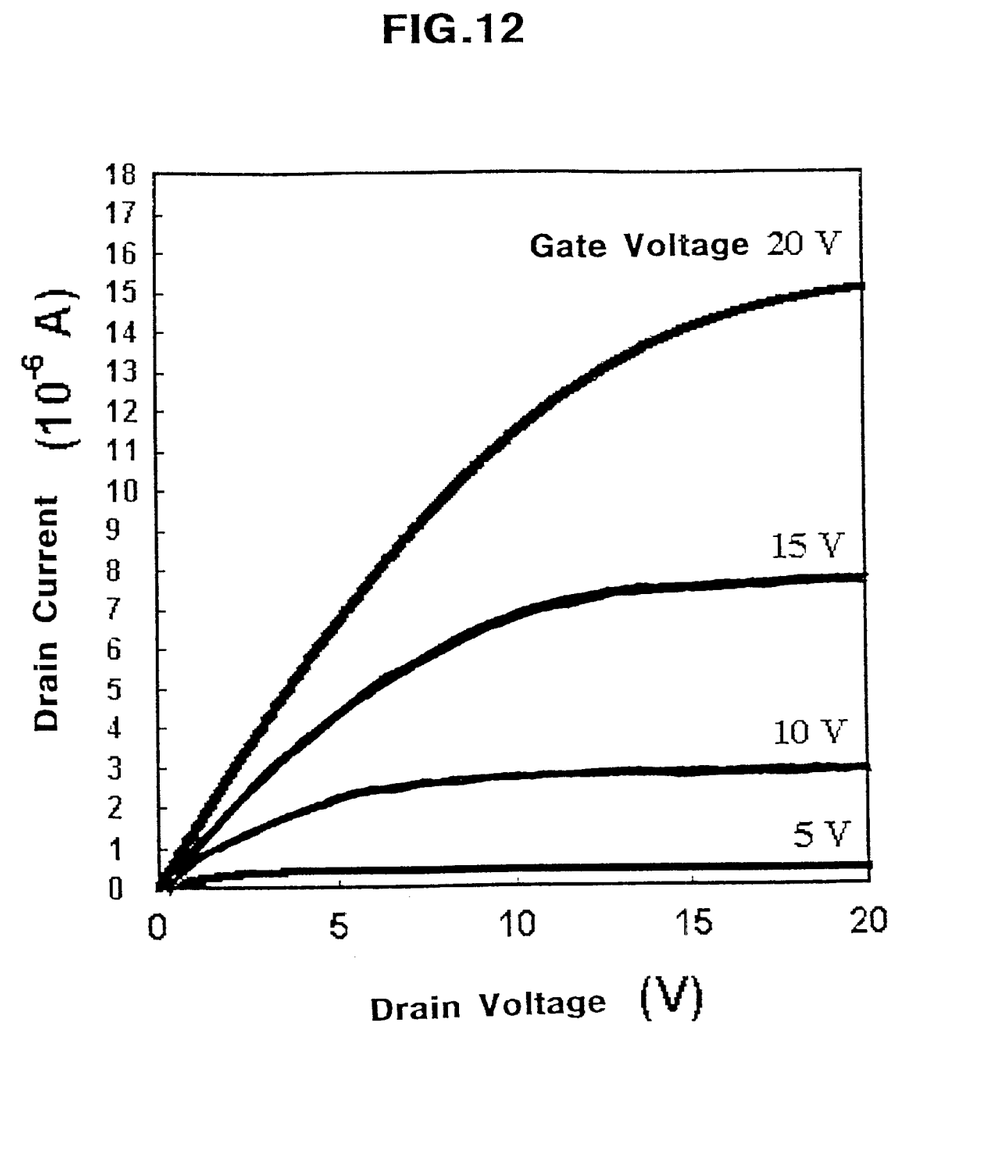
FIG. 12 illustrates a graph of an output characteristic of an amorphous silicon TFT fabricated by the present invention.
Figure 13:
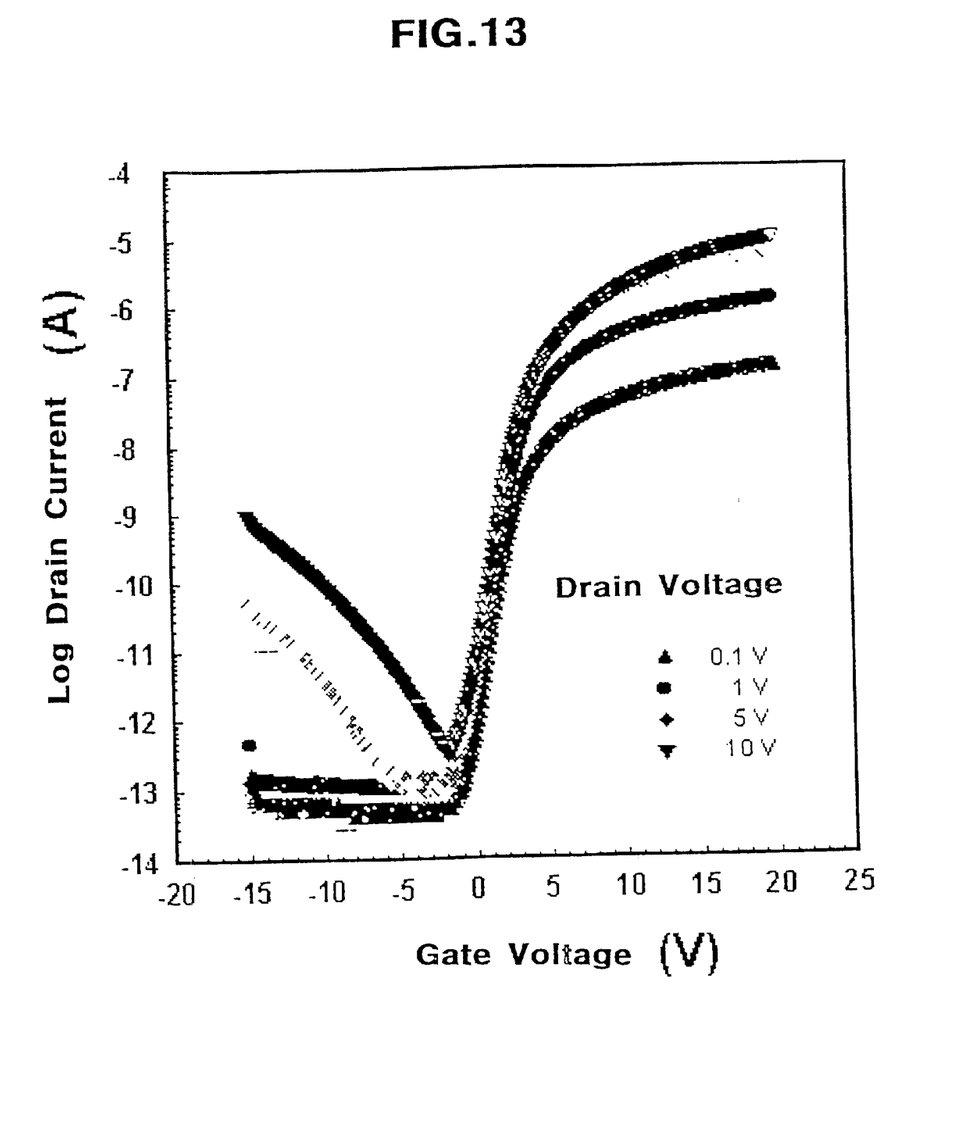
FIG. 13 illustrates a graph of a transition characteristic of an amorphous silicon TFT fabricated by the present invention.

FIG. 12 illustrates a graph of an output characteristic of a TFT fabricated by the present invention and FIG. 13 illustrates a graph of a transfer characteristic of a TFT fabricated by the present invention, wherein Cu and Ni are used as gate and source/drain metals, respectively.

FIG. 12 illustrates a graph of an output characteristic of a TFT fabricated by the present invention using an Al nitride layer as a buffer layer. As shown in the drawing, a W/L ratio, where W and L are width and length of a channel of TFT respectively, is 78 $\mu$m/14 $\mu$m. The drain current according to drain voltage is measured by applying 5V, 10V, 15V, and 20V to gate. In a low drain voltage area, a linear characteristic free from current crowding is shown. Current saturation appears at a high drain voltage, and drain current increases greatly according to the gate voltage increasing.

FIG. 13 illustrates a graph of a transfer characteristic of a TFT fabricated by the present invention using an Al nitride layer as a buffer layer, in which a transfer characteristic of Log [drain current vs. gate voltage] is shown. When the drain voltage is 5V and 10V, the off-current at gate voltage of −5V is $1 \times 10^{-13}$ A and $2.3 \times 10^{-13}$ A respectively.

As explained in the above description of the embodiments according to the present invention, the aluminum oxide or nitride buffer layer is deposited on the glass substrate and then succeeding process steps are carried out. Accordingly, the present invention enables use of a gate metal having a low resistance without deformation so as to increase the reliance of the succeeding processes. Moreover, the process of forming the buffer layer simplifies the complicated process of the related art, thereby enabling an increase in TFT productivity.

Further, the present invention uses the aluminum oxide or nitride buffer layer so as to increase the adhesion between a glass substrate and a metal having low resistance such as Cu or APC.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a thin film transistor, comprising:
    forming a first aluminum layer on the surface of a glass substrate;
    oxidizing the first aluminum layer;
    forming a metal gate on the first aluminum layer; and
    forming a thin film transistor structure that includes the metal gate over the substrate.

2. The method of claim 1, wherein the gate is formed of Cu.

3. The method of claim 1, wherein the gate is formed of Ag—Pd—Cu (APC).

4. The method of claim 1, wherein the forming a first aluminum layer step forms the first aluminum layer to a thickness of 10 nm or less.

5. The method of claim 1, wherein the forming a first aluminum layer step forms the first aluminum layer to a thickness of 3 to 5 nm.

6. The method of claim 1, further comprising:
    forming a second aluminum layer over the oxidized first aluminum layer and the gate; and
    oxidizing the second aluminum layer; and wherein
        the forming a thin film transistor structure step forms the thin film transistor structure over the oxidized second aluminum layer.

7. The method of claim 6, wherein the oxidizing the first and second aluminum layer steps perform oxidation using dry plasma.

8. The method of claim 6, wherein the oxidizing the first and second aluminum layer steps form the first and second aluminum layers into alumina.

9. The method of claim 6, wherein the forming a second aluminum layer step forms the second aluminum layer to a thickness of 6 nm or less.

10. The method of claim 6, wherein the forming a second aluminum layer step forms the second aluminum layer to a thickness of 3 to 5 nm.

11. The method of claim 1, further comprising:
    forming a second aluminum layer over the first aluminum layer and the gate; and wherein
        the oxidizing step simultaneously oxidizes the first and second aluminum layers.

12. The method of claim 11, wherein the oxidizing step performs oxidation using dry plasma.

13. The method of claim 11, wherein the oxidizing step forms the first and second aluminum layers into alumina.

14. The method of claim 11, wherein the forming a second aluminum layer step forms the second aluminum layer to a thickness of 6 nm or less.

15. The method of claim 11, wherein the forming a second aluminum layer step forms the second aluminum layer to a thickness of 3 to 5 nm.

16. The method of claim 1, wherein the forming a thin film transistor structure step comprises:
    successively forming a gate insulating layer, a semiconductor layer, and an impurity-doped semiconductor layer.

17. The method of claim 1, wherein the gate insulating layer is silicon nitride, the semiconductor layer is amorphous silicon, and the impurity-doped semiconductor layer is impurity doped amorphous silicon.

18. A method of fabricating a thin film transistor, comprising:
    forming a first aluminum nitride layer on a glass substrate;
    forming a metal gate on the first aluminum nitride layer; and
    forming a thin film transistor structure that includes the metal gate over the substrate.

19. The method of claim 18, wherein the gate is formed of Cu.

20. The method of claim 18, wherein the gate is formed of Ag—Pd—Cu (APC).

21. The method of claim 18, wherein the forming a first aluminum nitride layer step forms the first aluminum nitride layer to a thickness of 10 nm or less.

22. The method of claim 18, wherein the forming a first aluminum nitride layer step forms the first aluminum nitride layer to a thickness of 3 to 5 nm.

23. The method of claim 18, further comprising:
   forming a second aluminum nitride layer over the first aluminum nitride layer and the gate; and wherein
   the forming a thin film transistor structure step forms the thin film transistor structure over the second aluminum nitride layer.

24. The method of claim 23, wherein the forming a first and second aluminum nitride layer steps form the first and second aluminum nitride layers by reactive sputtering using a pure aluminum target and nitrogen gas.

25. The method of claim 23, wherein the forming a second aluminum layer step forms the second aluminum layer to a thickness of 20 nm or less.

26. The method of claim 23, wherein the forming a second aluminum layer step forms the second aluminum layer to a thickness of 5 to 10 nm.

27. The method of claim 18, wherein the forming a thin film transistor structure step comprises:
   successively forming a gate insulating layer, a semiconductor layer, and an impurity-doped semiconductor layer.

28. The method of claim 18, wherein the gate insulating layer is silicon nitride, the semiconductor layer is amorphous silicon, and the impurity-doped semiconductor layer is impurity doped amorphous silicon.

* * * * *